Nov. 21, 1967 M. MICHELITSCH 3,354,007

METHOD OF FORMING, A SEMICONDUCTOR BY DIFFUSION BY USING A CRYSTAL MASKING TECHNIQUE

Filed April 2, 1965 2 Sheets-Sheet 1

INVENTOR.
MICHAEL MICHELITSCH

BY Thomas J. Kilgannon, Jr.
ATTORNEY

United States Patent Office 3,354,007
Patented Nov. 21, 1967

3,354,007

METHOD OF FORMING A SEMICONDUCTOR BY DIFFUSION BY USING A CRYSTAL MASKING TECHNIQUE

Michael Michelitsch, Stuttgart, Vaihingen, Germany, assignor to International Business Machines Corporation, New York, N.Y., a corporation of New York Filed Apr. 2, 1965, Ser. No. 445,065
Claims priority, application Germany, June 9, 1964, J 25,999
15 Claims. (Cl. 148—187)

ABSTRACT OF THE DISCLOSURE

This invention relates to a method for producing crystallographically oriented crevices in a masking material which overlies the surface of a crystalline substrate material to provide micron size apertures in the mask through which dopants may be introduced to fabricate semiconductor devices. The process includes the step of heating a crystalline substrate, gallium arsenide, for example, which has a coating of a masking material, silicon dioxide, for example, disposed on a surface thereof to a temperature (700°–800° C.) sufficient to produce crystallographically oriented crevices in the masking material. Prior to heating, the masking material may be grooved by sawing or etching to produce, upon heating, a specific number of crevices having a desired orientation. The grooves may be built up by depositing regions of masking material which are thicker than an initially deposited coating of the masking material. After producing the crevices, impurities or dopants may be introduced into the crystalline substrate by diffusion, for example, to fabricate active semiconductor devices.

In the fabrication of semiconductor components, it is known to define the areas of a semiconductor single crystal to be coated, doped, etched or otherwise processed by means of masks. For that purpose, protective layers consisting of metallic or non-metallic substances are provided with apertures corresponding to the desired mask configuration by mechanical processing or by photo-etching techniques. It has been possible to use that method to advantage only in the fabrication of masks having relatively large apertures, whereas in the fabrication of masks with very small apertures, i.e. apertures on the order of a few tenths to a few microns, the masks made by the indicated technique exhibits a number of serious disadvantages. Thus, it is already difficult even to make the areas having such small apertures with a sufficient degree of exactness and reproducibility. Moreover, the step of cleaning the areas exposed by the mask apertures following the fabrication of the masks has caused extraordinary difficulties as the etchants used in the cleaning step act primarily on the edges while the corners enclosed by two surfaces are influenced only slowly and poorly. This condition is felt to be of particular disadvantage with small mask apertures of a few tenths of a micron in one dimension and great longitudinal dimensions of several millimeters. The etching step necessarily following the mask fabrication to cleanse the exposed areas is an especially difficult and time-consuming process phase including several steps, which has proved to be of great disadvantage in the mass production of semiconductor components.

In order to solve this problem, the invention proposes a crystal masking technique, particularly for masking semiconductor single crystals for the purpose of fabricating semiconductor components, which is characterized in that the crystal is coated with a protective layer the thermal coefficient of expansion of which is lower than that of the crystal and that both are thereafter subjected to a fast heating process for producing narrow crevices or fissures in said protective layer extending in the directions of crystallographic axes of the crystal and serving as mask apertures.

It is, therefore, an object of this invention to provide a masking technique for producing apertures of sub-micron size which is superior to prior art techniques.

Another object is to provide a masking technique which produces sub-micron size apertures without resorting to the usual etching techniques.

Another object is to provide a method of producing sub-micron size apertures in a mask which is fast, accurate and amenable to mass production techniques.

A further object is to provide a method of producing apertures in masks which are extremely narrow relative to the long dimensions of the apertures.

Still another object is to provide a method of producing apertures in masks which takes advantage of crystallographic orientation effects in semi-conductor materials.

Yet another object is to provide a method of producing apertures in masks which utilizes differences in the coefficients of thermal expansion of different materials to generate sub-micron apertures in masking materials.

A feature of this invention is the utilization in a method for producing micron size apertures in a masking material which overlies a surface of a substrate material which has a given coefficient of expansion, of the step of producing crevices in the masking material by subjecting said masking material and said substrate to heat.

Another feature is the utilization of the step of producing crevices in the masking material having a preferred orientation.

Another feature is the utilization of the step of grooving the masking material in the direction of a crystallographic axis of the substrate to produce crevices having the same orientation.

Another feature is the utilization of the step of introducing a material different from the substrate material into the substrate material as by diffusion, for instance.

Another feature is the utilization of the step of providing a masking material having a coefficient of thermal expansion different from said given coefficient of thermal expansion.

Let another feature is the utilization of the steps of selecting a wafer of gallium arsenide the surface of which is oriented in the (111) plane. The surface is then coated with silicon dioxide which has a temperature coefficient of expansion different from the gallium arsenide. The coated gallium arsenide is then heated to a temperature in the range of 700° to 800° C. to cause the formation of apertures in the form of cracks in the silicon dioxide; the cracks being preferably oriented in the direction of the <211> crystallographic axis of the gallium arsenide wafer.

The foregoing and other objects, features, and advantages of the invention will be apparent from the following more particular description of preferred embodiments of the invention, as illustrated in the accompanying drawings, wherein.

Figure 1:
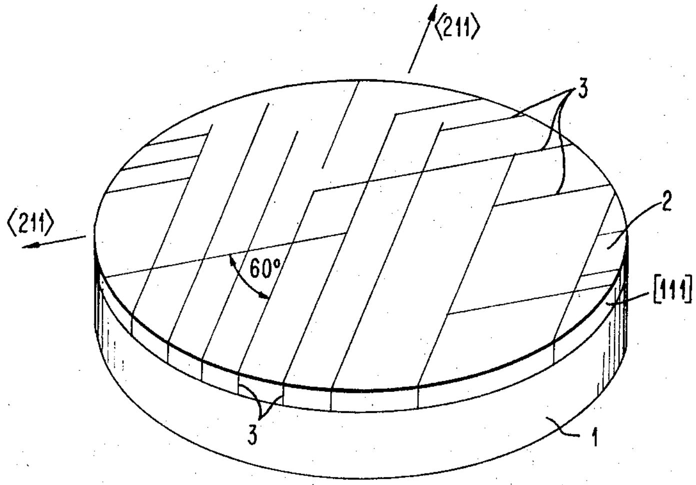
FIG. 1 illustrates a gallium arsenide single-crystal wafer coated with a silicon dioxide layer containing fissures.

In accordance with an improved version of the invention, it is proposed that for the selection of certain given areas and/or one or more of the directions possible in view of the crystallographic structure within the surface to be masked, the process of heating the crystal coated with the protective layer be carried out by means of linear heat sources arranged in suitable positions and directions or by means of heat sources effective in linear areas.

In accordance with another embodiment of this invention, it is proposed that the protective layer be coated with an additional layer which, due to its mechanical resistance, prevents the occurrence of fissures and which leaves those areas exposed which are to be used for the production of fissures and are preferably oriented along a crystallographic axis.

It may, however, also be desirable to utilize the technique so that said protective layer is traversed by channels oriented along a preferred crystallographic direction and having a thickness meant to promote the production of fissures and provided the protective layer in the regions separating said channels from one another is of a thickness which prevents the production of fissures in these regions. The protective layer may be produced either by depositing the layer or by an etching technique, preferably a photo-etching technique.

The fissures or crevices may also be produced by simultaneously heating and subjecting the coated crystal to externally applied mechanical strains by means of electric or magnetic fields which can produce standing waves in the crystal structure.

In accordance with an improved version of the invention, it is proposed that the masking process be carried out in a container suitable for performing subsequent steps such as epitaxial coating, diffusing or the like, and that the subsequent steps follow so rapidly that the extremely high purity of the surface areas of the crystal being processed which is affected, if at all, only to a minor degree.

According to a particularly advantageous embodiment of this invention, the present method may be used for producing extremely narrow, sharply defined, straight-line PN junctions suited especially well for use as self-stimulated lasers.

In accordance with an especially useful version of the invention, the masks produced by the said technique are suitable for making so-called hetero-junctions, i.e. junctions between two different substances, such as junctions between a germanium and a silicon layer or between a germanium and a gallium arsenide layer.

According to another, particularly advantageous embodiment of the invention, it is proposed that after the coating or doping of the crystal surface exposed by the formation of fissures, which has been performed in a first method step serving the formation of junctions; the fabricating process be continued by depositing additional protective layers, forming fissures and causing additional coating or doping of the areas exposed by such repeated fissure formation for the purpose of producing semiconductor components having a plurality of junctions.

For the further processing of the components made by the above described technique, it is proposed in accordance with this invention that the thus obtained semiconductor wafers including elongated junctions be divided by any desired methods known into semiconductor components with a predetermined length of junction or junctions.

Experiments that have been conducted with the technique of this invention have shown that it is of particular advantage if a monocrystalline gallium arsenide wafer, the surfaces of which are oriented in the (111) plane, is coated with a protective layer of silicon dioxide with a thickness of approximately 5000 Angstrom units and is thereafter, in a container suited preferably for epitaxial coating by gas transport or for diffusion by gas transport, heated to a temperature of 700° C. to 800° C. until a desired number of fissures extending in <211>-directions have been formed.

According to an improved version of the technique of this invention, a method of producing gallium arsenide semiconductor diodes using the above described technique is proposed which is characterized in that monocrystalline, P-doped gallium arsenide wafer, the surfaces of which are oriented in the (111) plane, be coated with a protective layer of silicon dioxide to a thickness of approximately 5000 Angstrom units and thereafter heated to a temperature of approximately 700° C. to 800° C. in a container suited for epitaxial coating by gas transport until a desired number of fissures extending in the <211>-direction have occurred, that thereafter said gallium arsenide wafer coated with a fissured silicon dioxide layer be subjected at 600° C. to 850° C. to a gas stream comprising vaporous arsenic, a small amount of selenium, gallium chloride and hydrogen until a layer of N-doped gallium arsenide has been built up starting from those areas of said gallium arsenide wafer exposed by said fissures, filling said fissures and overhanging them mushroom-like, that the gallium arsenide layers overhanging the individual fissures mushroom-like are provided with contacts, e.g. by alloying tin dots into them, and that finally said gallium arsenide wafer is divided into an appropriate number of semmiconductor components each having a PN junction of a suitable length.

Referring to FIG. 1, there is shown a circular gallium arsenide semiconductor wafer 1 the surface of which is oriented in the (111) plane. The gallium arsenide wafer 1 is coated with a silicon dioxide layer 2 having a thickness of approximately 5000 Angstrom units and traversed by fissures 3 extending in the <211>-direction. As may be noted from FIG. 1, the illustrated fissures extend either in mutually parallel directions or in directions intersecting under an angle of 60 degrees, both of these directions coinciding with the crystallographic <211>-directions of the gallium arsenide semiconductor wafer 1. The highly rectilinear and regular fissures 3 are throughout approximately 0.1 micron wide. The fissures are produced by heating the illustrated arrangement to about 800° C. and are due to the differential thermal coefficients of expansion of the layers 1 and 2.

Figures 2, 3, 4:
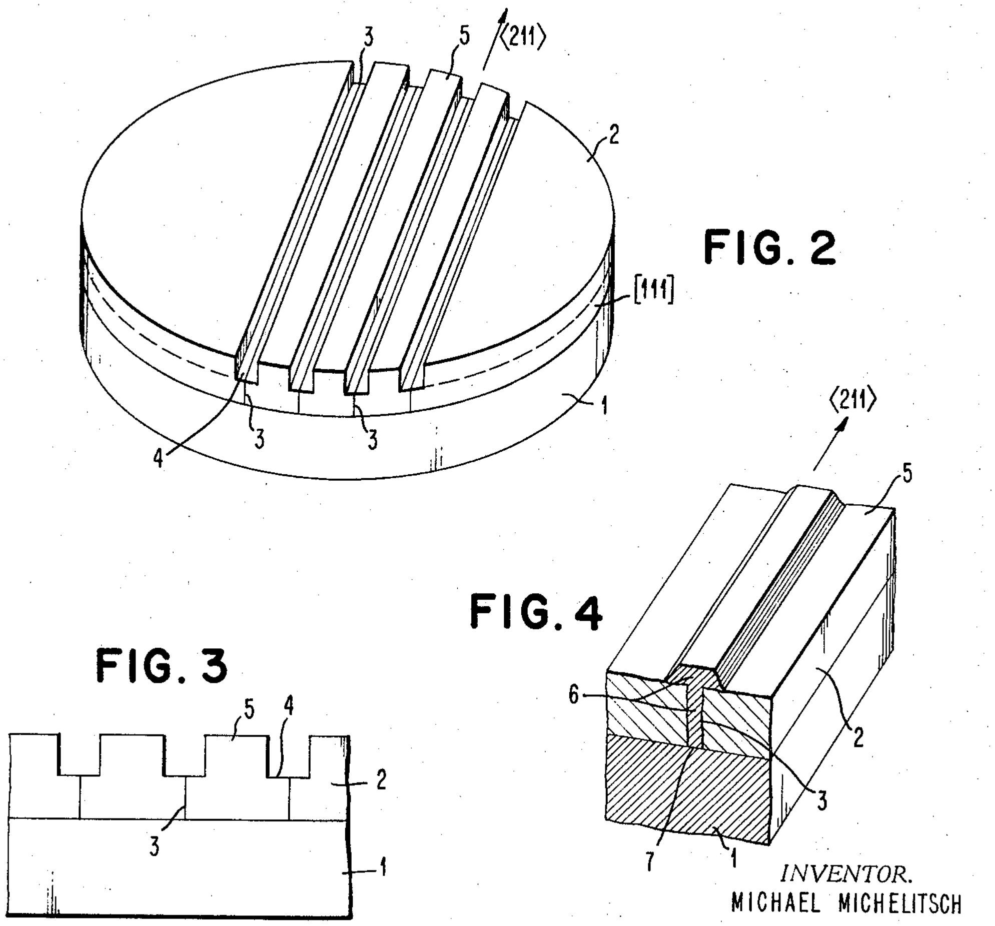
FIG. 2 shows a gallium arsenide single-crystal wafer coated with a slicon dioxide layer containing channels.
FIG. 3 represents an enlarged sectional view of the wafer shown in FIG. 2.
FIG. 4 shows a cutaway portion of a gallium arsenide single-crystal wafer which is coated with a fissured silicon dioxide layer and in which the illustrated fissure is filled by epitaxial growth with a gallium arsenide layer.

Referring to FIG. 2, a gallium arsenide semiconductor wafer 1 is covered with a silicon dioxide layer 2 including channels 4. The channels 4, the width of which has been exaggerated in the illustration, have the purpose of restricting the production of the fissures 3, which occur irregularly and at unforeseeable points of the silicon dioxide layer, to the bottom surfaces of the channels 4. It is thus possible to select the areas to be provided with fissures. The thickness of the silicon dioxide layer 2 is approximately 5000 Angstrom units at the bottoms of the channels, while the raised regions 5 left between the channels 4 have a thickness of approximately 10,000 Angstrom units. Experiments have shown that an oxide layer on the order of 5000 Angstrom units in thickness has a substantially higher tendency to break in the region of 5000 Angstrom units than the oxide layer in the region of 10,000 Angstrom units. Making the channels 4 extremely narrow, insures that only a single, generally continuous and straight fissure 5 occurs in each channel.

FIG. 3 shows a sectional view of the arrangement illustrated in FIG. 2. From this illustration, it should be clear that channels or grooves 4 may be formed by etching or cutting the silicon dioxide layer 2 or by depositing an additional layer on a previously deposited layer. By suitably masking, only the raised portions 5 will be deposited forming the channels 4.

FIG. 4 represents a cutway view of a gallium arsenide single-crystal wafer provided with a protective layer of silicon dioxide. The fissure 5 which is shown on a greatly magnified scale is filled by an epitaxial growing process with a layer 6 of gallium arsenide building up upon the gallium arsenide substrate 1 and extending mushroom-like above the fissure. Since the gallium arsenide single-crystal 1 is P-doped and the gallium arsenide region 6 is N-doped, the line 7 separating the said two regions acts as a PN junction. The arrangement shown in FIG. 4 constitutes a semiconductor diode with an elongated PN junction which has been produced by means of a silicon dioxide mask in which a fissure has been caused by thermal action.

Figure 5:
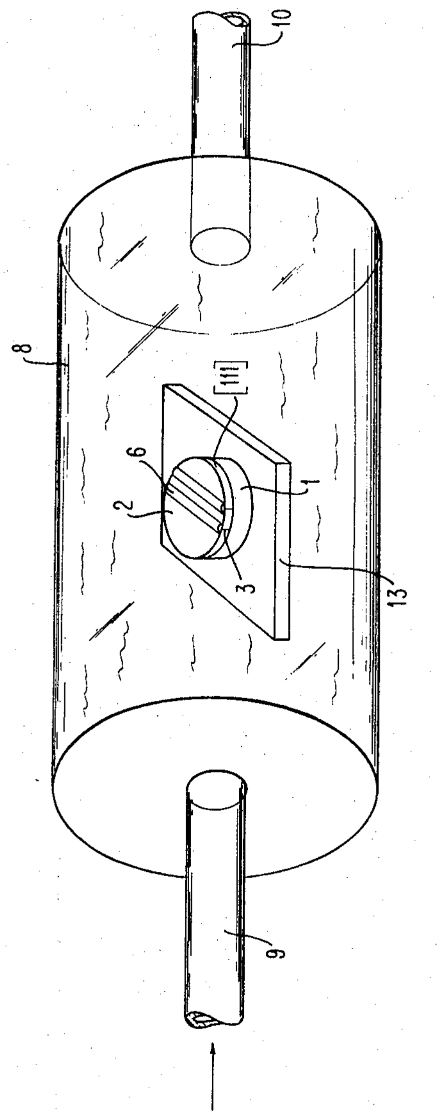
FIG. 5 illustrates an arrangement for carrying through the technique according to the invention.

Referring to FIG. 5, the arrangement for carrying through the technique according to the invention comprises a vessel 8 having an inlet conduit 9 and an exhaust conduit 10. Mounted within the vessel 8 is a plate 13 on which a gallium arsenide single-crystal wafer 1 is placed which is coated with a silicon oxide layer 2 approximately 5000 Angstrom units in thickness. For carrying through the technique, the silicon-dioxide coated gallium arsenide wafer is placed into the vessel 8 and heated to approximately 800° C. while at the same time a hydrogen stream is introduced. Due to the differential expansion of the layers 1 and 2, fissures 3 are produced. After the production of these fissures, a mixture of gallium chloride, arsenic, selenium and hydrogen is supplied through the supply pipe 9 at a temperature of 750° C., which causes an N-doped gallium arsenide layer to precipitate in the fissures 3. Thereafter the arrangement is cooled by a hydrogen stream supplied through the pipe 9. Contacts may be applied to the mushroom-like protruding parts of the regions 6 in accordance with the techniques known to those skilled in the semiconductor art.

While only gallium arsenide and silicon dioxide have been disclosed hereinabove as examples in the practice of the disclosed method, it should be understood that other semiconductors and masking materials having different coefficients of thermal expansion can be utilized to obtain the crevices or fissures described.

While the invention has been particularly shown and described with reference to preferred embodiments thereof, it will be understood by those skilled in the art that various changes in form and details may be made therein without departing from the spirit and scope of the invention.

What is claimed is:

1. In a process for producing apertures in a dielectric masking material which has a given thermal coefficient of expansion which overlies and is bonded to a surface of a semiconductor substrate having a different thermal coefficient of expansion the steps of:

grooving said masking material to permit the production of crevices having a preferred orientation within the grooves produced thereby, and heating said masking material and said substrate to a temperature sufficient to produce crystallographically oriented crevices in said masking material.

2. A method for producing apertures in a masking material comprising the steps of:

selecting a semiconductor substrate material having a given temperature coefficient of expansion, depositing on a surface of said substrate in bonded relationship therewith a dielectric masking material having a temperature coefficient of expansion different from said given temperature coefficient of expansion, grooving said masking material to produce crevices along the lengths of grooves produced thereby, and heating said substrate and said masking material to a temperature sufficient to cause the formation of apertures in the form of crystallographically oriented crevices in said grooves.

3. In a process according to claim 1 further including the step of:

introducing a material different from said substrate material into said substrate material by way of said crevices.

4. In a process according to claim 1 wherein the step of grooving said masking material includes the step of:

grooving said masking material in the direction of a crystallographic axis of said substrate.

5. A method according to claim 2 wherein the step of grooving includes the step of:

removing selected areas of said masking material to reduce the thickness of said masking material in said selected areas.

6. A method according to claim 2 wherein the step of grooving includes the step of:

coating selected areas of said masking material with an additional layer having a mechanical resistance which prevents the formation of crevices in said selected areas.

7. A method according to claim 2 wherein the step of depositing a masking material includes the step of:

depositing silicon dioxide having a thickness sufficient to permit the formation of crevices therein upon application of heat.

8. A method according to claim 2 wherein the step of depositing a masking material includes the step of:

depositing silicon dioxide having portions of a thickness not greater than 5000 Angstroms.

9. A method according to claim 2 wherein the step of heating includes the step of:

heating said substrate and said masking material to a temperature in the range of 700–800° C.

10. A method according to claim 2 wherein the step of grooving said masking material includes the step of:

grooving said masking material in the direction of the <211> crystallographic axis of said substrate.

11. A method for producing apertures in a masking material comprising the steps of:

selecting a wafer of gallium arsenide the surface of which is (111) oriented, coating said surface with silicon dioxide which has a temperature coefficient of expansion different from said gallium arsenide, and heating said coated gallium arsenide wafer to a temperature in the range of 700° to 800° C. to cause the formation of apertures in the form of cracks in said silicon dioxide, said cracks being preferably oriented in the direction of the <211> crystallographic axis of said gallium arsenide wafer.

12. A method according to claim 11 further including the step of:

grooving said silicon dioxide prior to heating to produce crevices along the length of the grooves produced thereby.

13. A method according to claim 12 wherein the step of grooving said silicon dioxide includes the step of:

grooving said silicon dioxide in the direction of the <211> crystallographic axis of said gallium arsenide.

14. A method according to claim 12 further including the step of:

introducing a dopant into said gallium arsenide to vary the conductivity type of said gallium arsenide.

15. In a process according to claim 1 wherein said given thermal coefficient of expansion is lower than the thermal coefficient of expansion of said substrate.

References Cited

UNITED STATES PATENTS

| | | | |
|---|---|---|---|
| 2,873,222 | 2/1959 | Derick | 148—189 |
| 3,055,776 | 9/1962 | Stevenson. | |
| 3,122,817 | 3/1964 | Andrus. | |
| 3,156,591 | 11/1964 | Hale | 148—15 X |
| 3,226,611 | 12/1965 | Haenichen | 148—187 |

HYLAND BIZOT, *Primary Examiner.*